(12) United States Patent
Devoe et al.

(10) Patent No.: US 7,307,829 B1
(45) Date of Patent: *Dec. 11, 2007

(54) INTEGRATED BROADBAND CERAMIC CAPACITOR ARRAY

(76) Inventors: Daniel Devoe, 1106 Barcelona, San Diego, CA (US) 92107; Alan Devoe, 5715 Waverly Ave., La Jolla, CA (US) 92037; Lambert Devoe, 3446 Stadium Pl., San Diego, CA (US) 92107

( * ) Notice: Subject to any disclaimer, the term of this patent is extended or adjusted under 35 U.S.C. 154(b) by 0 days.

This patent is subject to a terminal disclaimer.

(21) Appl. No.: 11/249,600

(22) Filed: Oct. 13, 2005

Related U.S. Application Data

(60) Continuation-in-part of application No. 11/199,978, filed on Aug. 9, 2005, now Pat. No. 7,075,776, which is a division of application No. 10/984,025, filed on Nov. 8, 2004, now Pat. No. 6,970,341, which is a continuation-in-part of application No. 10/412,992, filed on Apr. 14, 2003, now Pat. No. 6,816,356, which is a continuation-in-part of application No. 10/150,202, filed on May 17, 2002, now Pat. No. 6,587,327.

(51) Int. Cl.
*H01G 4/228* (2006.01)
*H01G 4/06* (2006.01)

(52) U.S. Cl. .................. 361/328; 361/306.1; 361/311; 361/303

(58) Field of Classification Search ............ 361/301.4, 361/303, 306.1, 306.3, 308.2, 309, 328–330, 361/310–311
See application file for complete search history.

(56) References Cited

U.S. PATENT DOCUMENTS

| | | | |
|---|---|---|---|
| 4,247,881 A | 1/1981 | Coleman | 361/302 |
| 4,665,465 A | 5/1987 | Tanabe | 361/306.3 |
| 5,177,663 A * | 1/1993 | Ingleson et al. | 361/321.2 |
| 5,576,926 A | 11/1996 | Monsorno | 361/303 |
| 5,870,273 A | 2/1999 | Sogabe et al. | 361/306.3 |
| 5,930,106 A | 7/1999 | Deboer et al. | 361/305 |
| 5,978,204 A | 11/1999 | Stevenson | 361/303 |
| 6,052,272 A | 4/2000 | Kuroda et al. | 361/303 |
| 6,208,501 B1 | 3/2001 | Ingalls et al. | 361/303 |
| 6,414,835 B1 | 7/2002 | Wolf et al. | 361/302 |
| 6,418,009 B1 | 7/2002 | Brunette | 361/306.3 |
| 6,515,842 B1 | 2/2003 | Hayworth et al. | 361/303 |
| 6,545,854 B2 | 4/2003 | Trinh et al. | 361/302 |
| 6,577,490 B2 * | 6/2003 | Ogawa et al. | 361/306.1 |
| 6,587,327 B1 | 7/2003 | Devoe et al. | 361/306.3 |
| 6,619,763 B2 | 9/2003 | Trinh et al. | 304/302 |

FOREIGN PATENT DOCUMENTS

JP  2000-106320  4/2000

*Primary Examiner*—Eric Thomas
(74) *Attorney, Agent, or Firm*—Wood, Herron & Evans, L.L.P.

(57) ABSTRACT

A monolithic capacitor structure includes opposed and overlapping plates within a dielectric body, which are arranged to form a lower frequency, higher value capacitor. Other conductive structure is located either inside the dielectric body or on an external surface thereof and is effective to form a higher frequency, lower value capacitor in parallel with the lower frequency, higher value capacitor. The resulting array of combined series and parallel capacitors integral with the dielectric body provides effective wideband performance in an integrated, cost-effective structure.

34 Claims, 11 Drawing Sheets

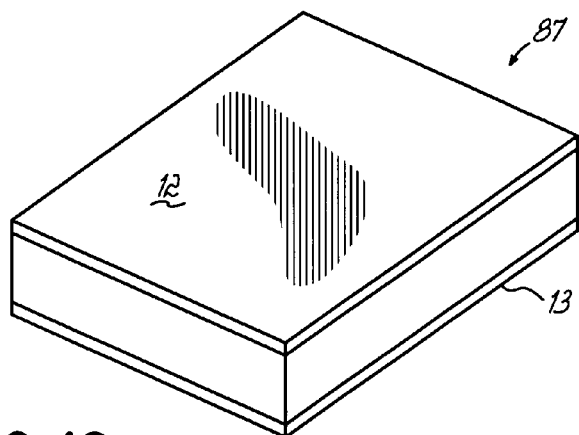
FIG. 16
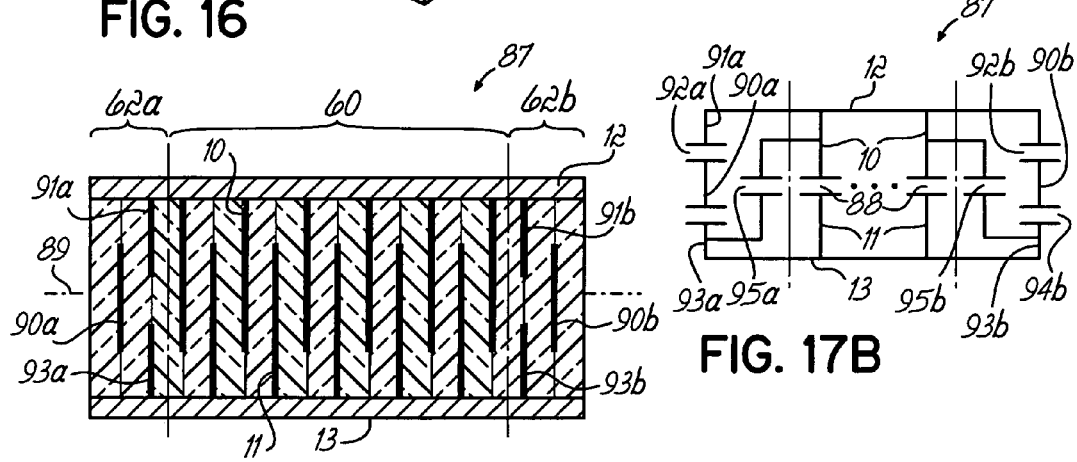
FIG. 17A
FIG. 17B
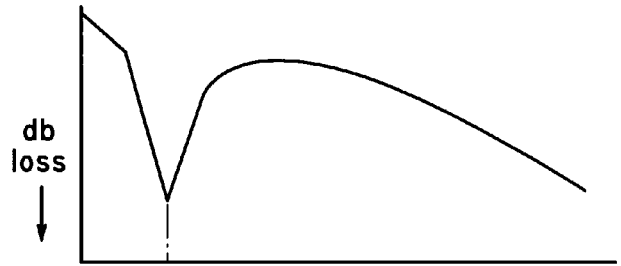
FIG. 21A
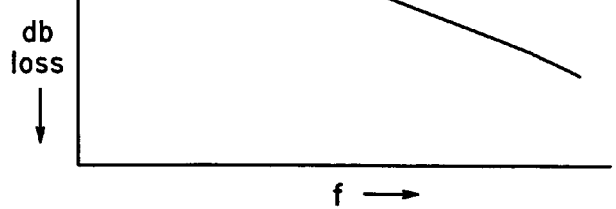
FIG. 21B

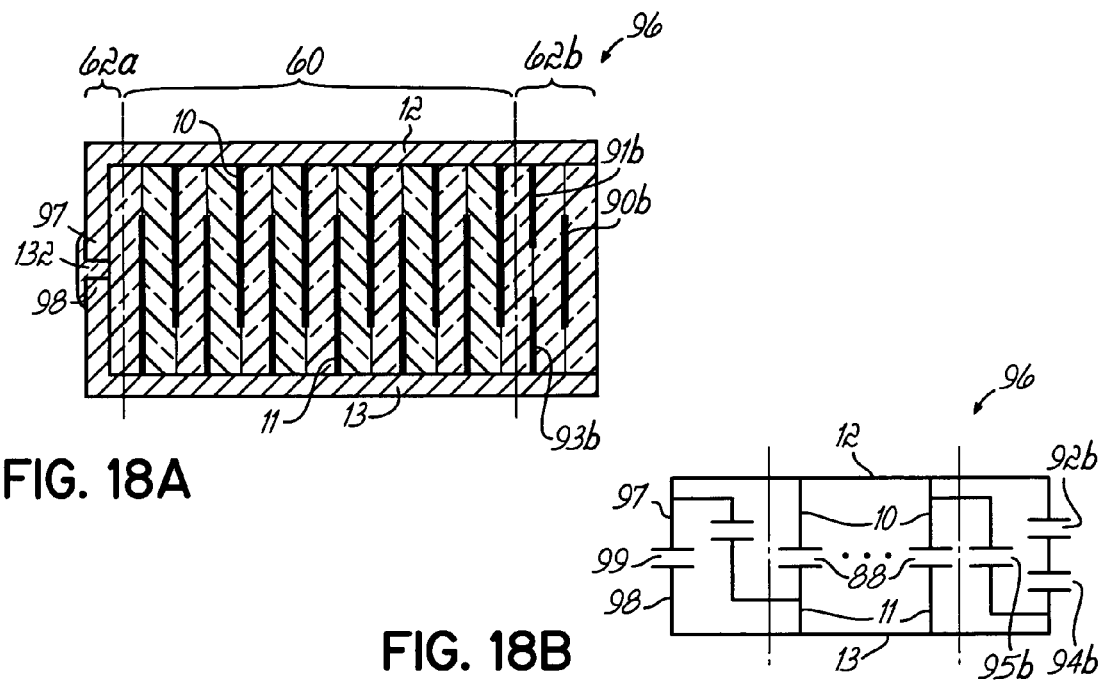
FIG. 18A
FIG. 18B
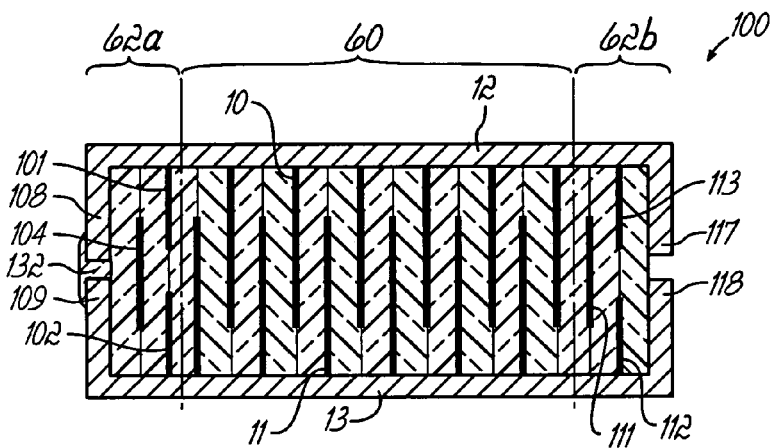
FIG. 19A
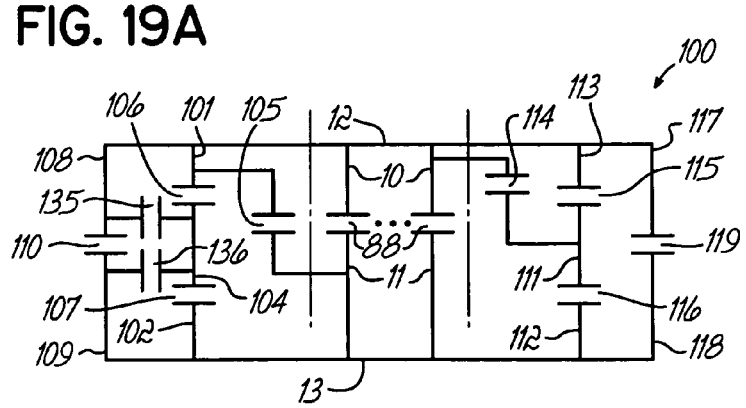
FIG. 19B

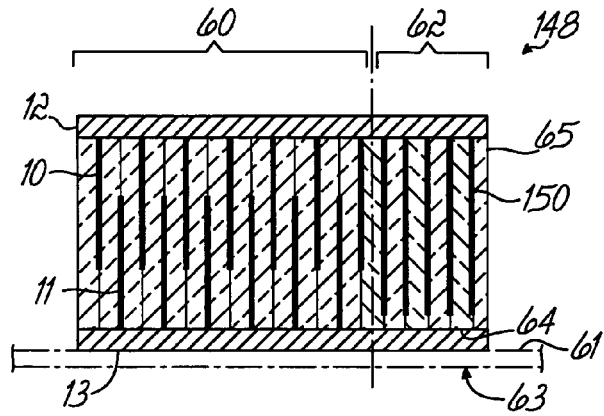
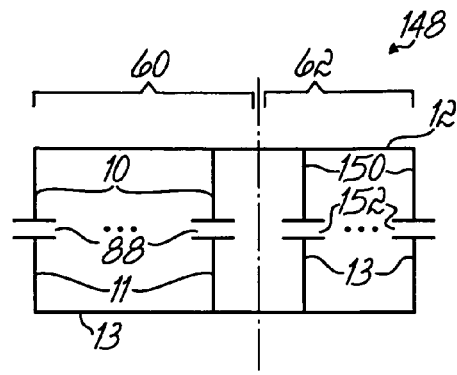
FIG. 24A    FIG. 24B
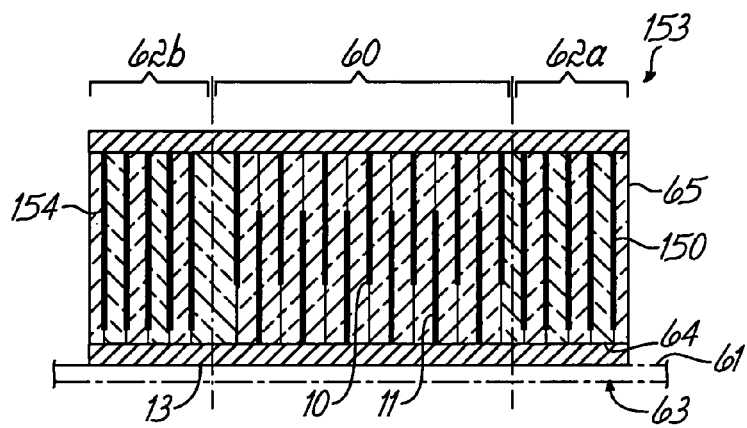
FIG. 25A
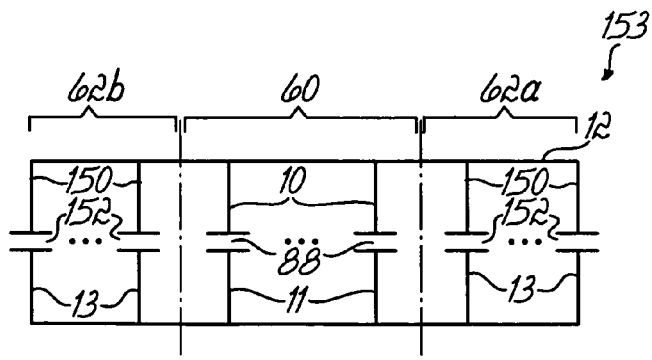
FIG. 25B

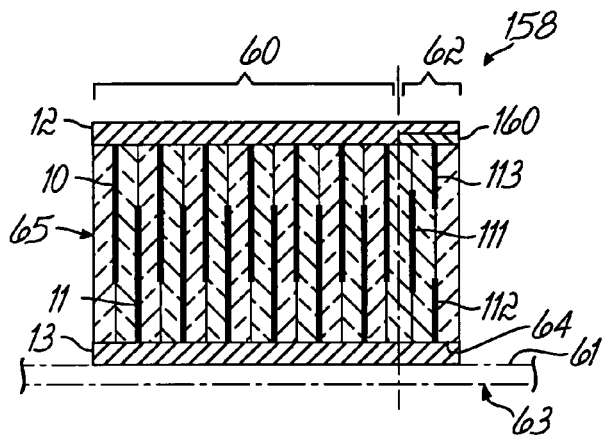
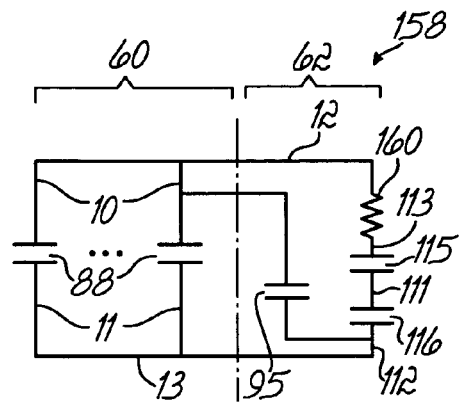
FIG. 26A  FIG. 26B
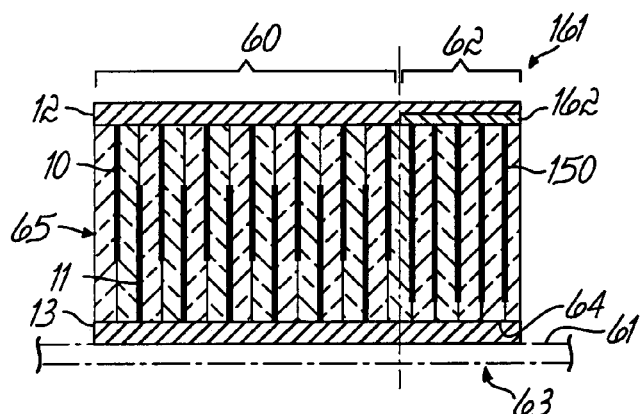
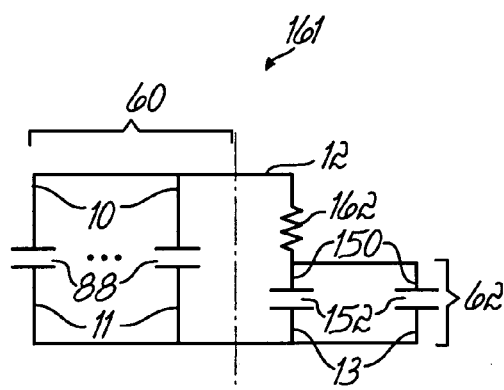
FIG. 27A  FIG. 27B
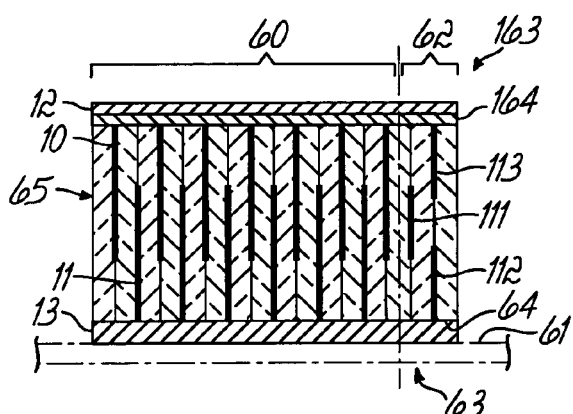
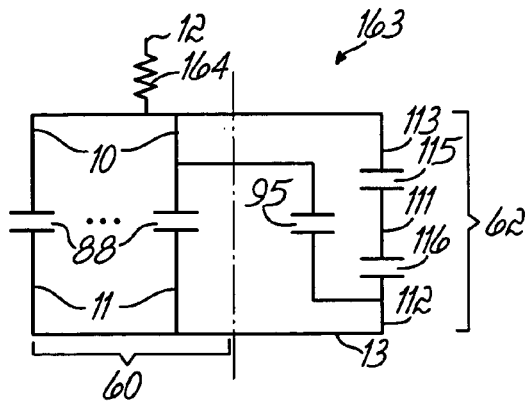
FIG. 28A  FIG. 28B

INTEGRATED BROADBAND CERAMIC CAPACITOR ARRAY

CROSS REFERENCE TO RELATED APPLICATIONS

This application is a continuation-in-part of U.S. application Ser. No. 11/199,978, filed Aug. 9, 2005, now U.S. Pat. No. 7,075,776, which is a divisional of U.S. application Ser. No. 10/984,025, filed Nov. 8, 2004, now U.S. Pat. No. 6,970,341, which is a continuation-in-part of U.S. application Ser. No. 10/412,992, now U.S. Pat. No. 6,816,356, filed Apr. 14, 2003, which, in turn, is a continuation-in-part of U.S. application Ser. No. 10/150,202, now U.S. Pat. No. 6,587,327, filed May 17, 2002, the entireties of which are incorporated by reference herein.

FIELD OF THE INVENTION

The present invention relates to miniature monolithic capacitors.

BACKGROUND OF THE INVENTION

The development of integrated circuits has made it possible to place many circuit elements in a single semiconductor chip. Where part or all of the circuit is an analog circuit, such as a radio frequency transmitter or receiver, audio amplifier, or other such circuit, circuit design requires lumped elements that cannot be readily realized in monolithic integrated circuits. Capacitors in particular are frequently created as separate elements from the integrated circuit. The electronic device thus typically includes monolithic integrated circuits combined with external capacitors.

For such applications, monolithic ceramic capacitors have been used. For example, single capacitors made of ceramic materials, are known in the art. These are relatively small in size and can be surface mounted to a surface mount circuit board, or glued and wire bonded to a substrate in a hybrid circuit layout.

FIG. 1A shows a lumped element model for a capacitor. In this ideal model, the capacitor provides an ideal voltage/current relationship:

$$i = C\frac{dv}{dt}$$

Unfortunately, particularly at high frequencies, capacitors used in electronic circuits deviate substantially from this ideal relationship. These deviations are generally modeled as an equivalent series resistance and equivalent series inductance, along with a capacitance that varies over frequency. In accordance with this model, a capacitor behaves as a series L-R-C circuit as illustrated in FIG. 1B. At lower frequencies, the dominant impedance is the capacitive element C; however, at increasing frequencies the impedance of the capacitive element C decreases and the impedance of the inductive element L increases; until, at the resonant angular frequency $(LC)^{-0.5}$, the inductive element becomes predominant, and the element ceases performing as a capacitor. Simultaneously, the capacitor dissipates some stored energy (typically through heating of conducting plates and traces), as represented by the series resistance R.

Capacitor design typically must compromise between capacitance value and equivalent series resistance and inductance; greater capacitance typically can be created only at the cost of increased series resistance and inductance. Accordingly, equivalent series resistance and inductance are not avoidable, and electronic design must take them into account, particularly in high frequency products such as broadband receiver/transmitters, short wave devices, and the like.

Various monolithic ceramic structures have been developed to provide relatively small capacitors for highly integrated applications. A first such structure, shown in FIG. 2A, is known as a "multilayer ceramic capacitor". This structure is formed by stacking sheets of green tape or greenware, i.e., thin layers of a powdered ceramic dielectric material held together by a binder that is typically organic. Such sheets, typically, although not necessarily, of the order of five inches by five inches, can be stacked with additional layers, thirty to one hundred or so layers thick. After each layer is stacked, conductive structures are printed on top of the layer, to form internal plates that form the desired capacitance. When all layers are stacked, they are compressed and diced into capacitors. Then, the compressed individual devices are heated in a kiln according to a desired time-temperature profile, driving off the organic binder and sintering or fusing the powdered ceramic material into a monolithic structure. The device is then dipped in conductive material to form end terminations for the internal conductive structures, suitable for soldering to a surface mount circuit board or gluing and wire bonding to a hybrid circuit.

The printed conductive structures are arranged in a pattern that provides one or more parallel-plate capacitors. For example, in the typical structure shown in FIG. 2A, internal plates 10 and 11 have been formed which extend from alternate sides of the combined structure. The conductive material 12 and 13 at each end forms a common connection point for each plate extending to that side. Plates 10 extend in pairs, each including an upper plate 10 and a lower plate 10' from the left side, and plates 11 extend similarly in pairs, each including an upper plate 11 and a lower plate 11' from the right side, forming parallel plate capacitors between each set of adjacent plates 10 and 11' and 10' and 11. The illustrated structure is arranged to reduce equivalent series resistance and inductance, by virtue of the plates 10 and 11 extending in pairs from each side. In other embodiments, plates extend individually from opposite sides, such as in the multilayer ceramic capacitor shown in FIGS. 7A and 7B and discussed below.

Each pair of overlapping plates 10 and 11 extending from opposite side metallizations 12 and 13, forms a parallel plate capacitor, such that the entire device forms a network of parallel connected capacitors as shown in FIG. 2B, which can be soldered to the traces 14 of a surface mount circuit board. The resulting equivalent capacitance value is relatively large for the device size, albeit subject to imperfections due to resistance in the many current-carrying conductive structures, and inductance resulting from many plates carrying currents flowing in opposite directions.

FIG. 3A shows an alternative known capacitor structure developed by Dielectric Laboratories, Inc. of Cazenovia, N.Y. and described in detail in U.S. Pat. No. 6,208,501. This structure includes a ceramic chip 20 having conductive end plates on its opposed surfaces, which is bonded by conductive epoxy 22 to conductive end terminations 24 which can then be soldered to the traces 26 on a surface mounting circuit board. As can be seen in FIG. 3B, the net effect is a single capacitor, rather than a parallel array, between the conductive ends of the device. As there is only one capacitor in this device, it has good high frequency performance (reduced resistance and inductance) but has a relatively low capacitance value.

FIG. 4A shows a second alternative capacitor structure developed by American Technical Ceramics Corporation and described in detail in U.S. Pat. No. 5,576,926. This structure includes a layered ceramic chip having an internal conductive plate 30 positioned to overlay conductive plates 32 and 33 extending along an outer surface of the device from conductive end terminations 34 and 35. As before, the conductive end terminations may be readily soldered to the traces 36 of a surface mount circuit board. As seen in FIG. 4B, the net effect is a series combination of two capacitors, between the conductive ends of the device. As in this case there is a series combination of capacitors (which has a lower capacitance value than either capacitor individually), the device has good high frequency performance but relatively low capacitance value.

A third alternative capacitor is shown in FIG. 5A. Here, the ceramic chip 20 with opposed conductive surfaces, shown in FIG. 3A, has been mounted directly to the trace 40 of a hybrid circuit device. The opposed side of the capacitor has been wire bonded through wire bond 42, to the opposite trace 44 of the hybrid device. In this case, the equivalent circuit diagram (FIG. 5B), and performance issues are the same as those with regard to the capacitor of FIG. 3A.

A final alternative capacitor is shown in FIG. 6A. Here, a series capacitor (FIG. 6B) has been formed between metallizations 51, 52 and 53 that are strictly on the outer surfaces of a ceramic chip 50. This alternative is similar to the device shown in FIG. 4A, but the internal metallization has been moved to the outer surface. This device is less complex to manufacture than the device of FIG. 4A, but provides lower capacitance value owing to the distance between the metallization layers 51 and 53 and the opposed metallization layer 52.

As can be seen, each known structure represents a tradeoff between capacitance value and broadband performance. One known approach to managing series resistance and series inductance, is to parallel connect two capacitors, such as shown in FIG. 7. In FIG. 7, a larger value capacitor C1, chosen for its large capacitance value, is connected in parallel to a smaller value capacitor, chosen for its small equivalent series resistance. As will be appreciated, this circuit exhibits multiple resonant frequencies, a first at the frequency $(L1C1)^{-0.5}$, and a second at the frequency $(L2C2)^{-0.5}$. Typically the larger valued capacitor C1 would have the larger series resistance and inductance value and thus the lower resonant frequency, whereas the smaller valued capacitor C2 would be chosen for high frequency performance resulting from low series resistance and series inductance values. At low frequencies, the larger value of C1 will produce acceptable performance, whereas at higher frequencies, where C1 behaves increasingly less like a capacitor and more like an inductance, C2 will be below its resonant frequency and perform well as a capacitor throughout the frequency of interest.

The parallel capacitor approach has been utilized in conjunction with ceramic chip capacitors, to improve the high frequency performance of those capacitors. Specifically, referring to FIG. 8A, one known broadband ceramic capacitor structure uses a multilayer capacitor, such as that described above with reference to FIG. 2A, which is stacked above and soldered or bonded to a single layer, high frequency capacitor such as that described above with reference to FIG. 3A. The resulting combined structure is wave soldered or bonded together with epoxy, producing a parallel combination of low and high-frequency capacitors seeking to achieve broadband performance. A second known implementation of this concept is shown in FIG. 8B. There, one of the side terminals of a multilayer capacitor such as described above with reference to FIG. 2A, is tilted against the upper surface of a single-layer, high frequency capacitor such as that described above with reference to FIG. 6A. The upper surface of the single-layer capacitor thus forms a first terminal of a parallel capacitor combination, that is wire bonded to a circuit board trace 36 in the manner described above with reference to FIG. 5A. The opposite side terminal of the multi-layer capacitor and the bottom surface of the single-layer capacitor are connected to a second trace 36 of the circuit board, thus forming the second terminal of the combined parallel capacitor combination.

While parallel capacitor combinations such as shown in FIGS. 8A and 8B have been used with some success in commercial devices, these combinations suffer from a number of drawbacks. First, the measured capacitance of these parallel combinations exhibit variations (resonances and dropouts), likely due to a mismatch between the resonances of the effective L-R-C circuits that are created by the parallel connected capacitors. Furthermore, the upper frequency response of even these parallel combinations may not meet the requirements of very wide band (GHz) devices in current use. Also, the mechanical stacking of dual ceramic capacitors in the manner shown is not easily compatible with "tape and reel" assembly methods and thus, are cumbersome and expensive to implement in mass production. Further, mechanically stacking dual ceramic capacitors increases the overall height of the circuit board assembly above that of a board having only single ceramic capacitors.

There accordingly is a remaining need for a broadband capacitor meeting the performance needs of modern wideband circuits, while maintaining the size and cost efficiencies of existing ceramic capacitors.

SUMMARY OF THE INVENTION

The present invention provides a capacitor having an effective wideband performance in an integrated, cost-effective structure. The capacitor of the present invention is an integrated array of capacitors connected in series and/or parallel circuits in a substantially monolithic dielectric body. The composition of the integrated capacitor array can be varied in order to tune the wideband capacitor to a particular application. Further, the integrated capacitor array of the present invention provides superior performance by providing less insertion loss than combinations of discrete capacitors. In addition, the wideband capacitor of the present invention is smaller and easier to handle and mount on a circuit board than combinations of discrete capacitors.

In accordance with principles of the present invention, a monolithic capacitor includes both a multi-layer, lower frequency, higher valued capacitor and a higher frequency, lower valued capacitor. More specifically, a dielectric body includes a series of conductive plates arranged in a substantially parallel and opposed configuration in one region of the body, to form the lower frequency, lower value, capacitor. In another region of the dielectric body, other conductive structures or plates are positioned to form a higher frequency, lower value capacitance in parallel with the lower frequency, higher value capacitance.

In specific disclosed embodiments, the conductive structures may be one or more conductive plates positioned inside the dielectric body with respect to a conductive floating plate. Alternatively, the conductive structures may be placed either on an external surface of the dielectric body, or inside the dielectric body and connected by one or more vias to plates on an external surface of the dielectric body. The conductive structures can further be opposed edges that are positioned to form a fringe-effect capacitance.

In the disclosed embodiments, the capacitor has a substantially monolithic dielectric body formed from a plurality of ceramic tape layers laminated together in a green ceramic state and fired to form a sintered or fused monolithic ceramic structure. However, other dielectric materials and assembly methods may be used. Further, in the disclosed embodiments the dielectric body has a hexahedral shape, with electrical contacts positioned on opposed end surfaces. However, other shapes may also be used.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

FIG. 16 is a perspective view of a still further embodiment of an integrated wideband capacitor in accordance with the principles of the present invention.

FIG. 17A illustrates an embodiment of the capacitor of FIG. 16, and FIG. 17B illustrates an equivalent circuit diagram for this embodiment.

FIG. 18A illustrates another embodiment of the capacitor of FIG. 16, and

FIG. 18B illustrates an equivalent circuit diagram for this embodiment.

FIG. 19A illustrates a further embodiment of the capacitor of FIG. 16, and

FIG. 19B illustrates an equivalent circuit diagram for this embodiment.

FIG. 21A is a graph representing insertion loss of a combination of discrete capacitors such as those shown in FIG. 8A.

FIG. 21B is a graph representing insertion loss of an integrated wideband capacitor such as that shown in FIG. 9A.

FIG. 24A illustrates a still further embodiment of an integrated wideband capacitor in accordance with further aspects of the present invention, and FIG. 24B illustrates an equivalent circuit diagram for this embodiment.

FIG. 25A illustrates a still further embodiment of an integrated wideband capacitor in accordance with further aspects of the present invention, and FIG. 25B illustrates an equivalent circuit diagram for this embodiment.

FIG. 26A illustrates a still further embodiment of an integrated wideband capacitor in accordance with further aspects of the present invention, and FIG. 26B illustrates an equivalent circuit diagram for this embodiment.

FIG. 27A illustrates a still further embodiment of an integrated wideband capacitor in accordance with further aspects of the present invention, and FIG. 27B illustrates an equivalent circuit diagram for this embodiment.

FIG. 28A illustrates a still further embodiment of an integrated wideband capacitor in accordance with further aspects of the present invention, and FIG. 28B illustrates an equivalent circuit diagram for this embodiment.

DETAILED DESCRIPTION

Figure 2A:
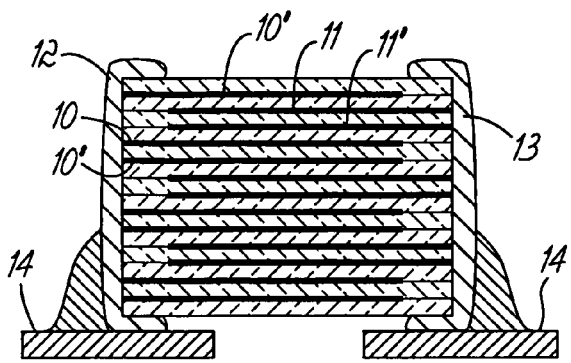
FIGS. 2A and 2B illustrate a known multilayer monolithic capacitor structure and its equivalent circuit diagram.
Figure 2B:
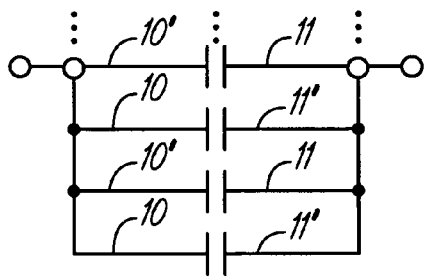
Figure 3A:
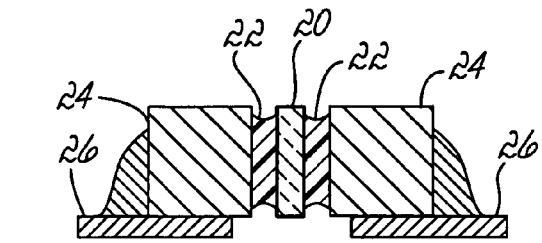
FIGS. 3A and 3B illustrate a known high frequency single layer monolithic capacitor structure and its equivalent circuit diagram.
Figure 3B:
Figure 4A:
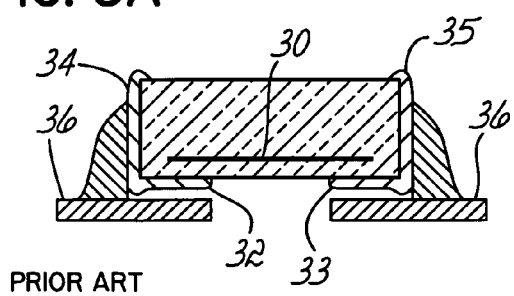
FIGS. 4A and 4B illustrate a known high frequency buried layer monolithic capacitor structure and its equivalent circuit diagram.
Figure 4B:
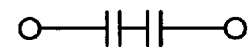
Figure 5A:
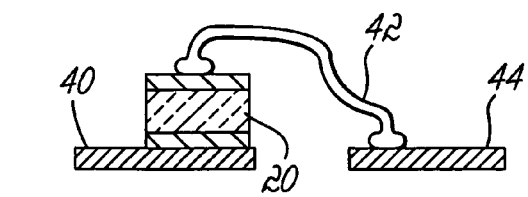
FIGS. 5A and 5B illustrate a known high frequency single layer monolithic capacitor structure and its equivalent circuit diagram.
Figure 5B:
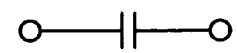
Figure 6A:
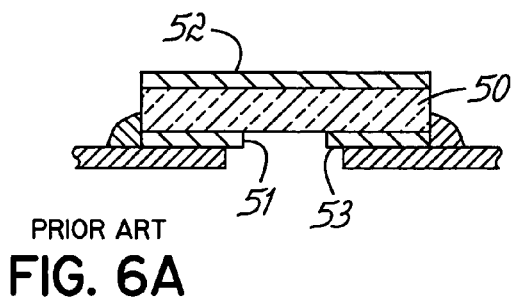
FIGS. 6A and 6B illustrate a known high frequency single layer monolithic capacitor structure and its equivalent circuit diagram.
Figure 6B:
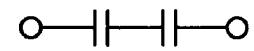
Figure 7:
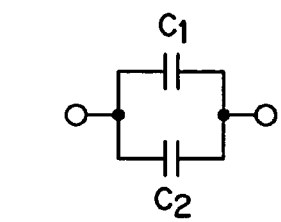
FIG. 7 illustrates a circuit diagram of a known parallel combination of capacitors to form a wideband capacitor.
Figure 9A:
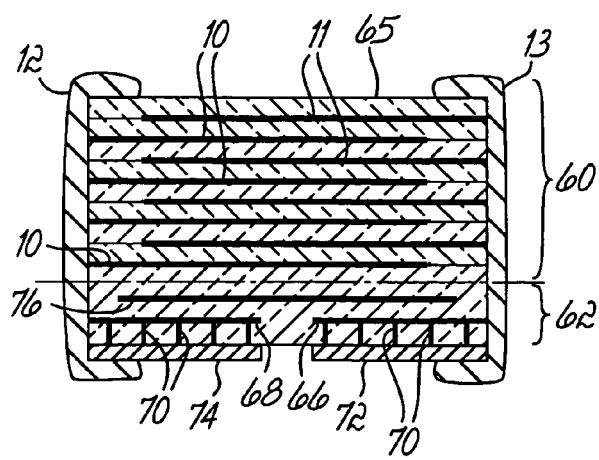
FIG. 9A illustrates a first embodiment of an integrated wideband capacitor in accordance with one aspect of the present invention.

Referring now to FIG. 9A, a first embodiment of an integrated capacitor in accordance with certain aspects of the invention can be described. In this embodiment, an integrated multi-layer and high frequency capacitor includes an upper section 60 including a multi-layer structure similar to that discussed above with reference to FIG. 2A, including plates 10 and 11 extending from conductive contacts 12 and 13, respectively, on opposite sides of a ceramic dielectric body. In this embodiment, individual plates extend from each side contact, rather than pairs of plates as shown in FIG. 2A. Using single plates in this manner increases the series inductance and resistance, for the reason that more current is caused to flow over each individual plate; however, more plates can be included in the capacitor using single plates, allowing an increase in capacitance value. Thus, the decision to use single or multiple plates is a tradeoff between capacitance and series resistance and inductance.

In the embodiment of FIG. 9A, a high frequency capacitor 54 is formed in a lower section 62, from two additional internal plates 66 and 68 which extend from the end contacts 13 and 12, respectively. These internal plates are connected by vias 70 to external conductive plates 72 and 74, respectively, which are printed on the first and second exterior surfaces 58, 59, respectively, of the ceramic dielectric body 65. Multiple conductive paths are thus provided to the interior plates 66 and 68 to reduce series resistance. Plates 66 and 68 are capacitively coupled to a floating interior plate 76, forming a series combination of capacitances 67, 69, from plate 66 to plate 76, and from plate 76 to plate 68. The internal plates 10, 11, 66, 68 and 76 are substantially perpendicular to the external surfaces 58, 59; and the capacitor 54 is often mounted with the external surfaces 58, 59 substantially parallel to a major surface 61 of a printed circuit board ("PCB") 63.

It has been found that the high frequency performance of the device of FIG. 9A is affected by the relative position of plate 76 and the nearest multi-layer plate 10 in upper section 60 of the device directly above plate 76. Accordingly, the high frequency performance is a function of the capacitance between plate 76 and the plate 10 immediately above plate 76 in the upper section 60 of the device.

Figure 8A:
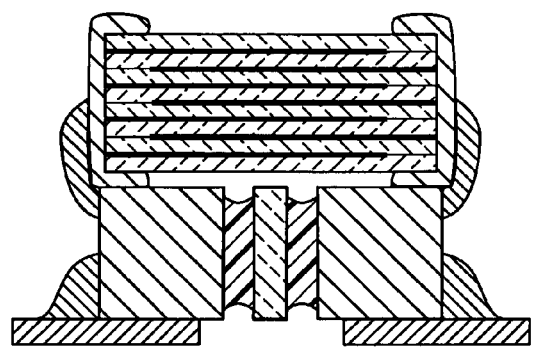
FIGS. 8A and 8B illustrate known implementations of a parallel combination of capacitors using known capacitors previously illustrated.
Figure 8B:
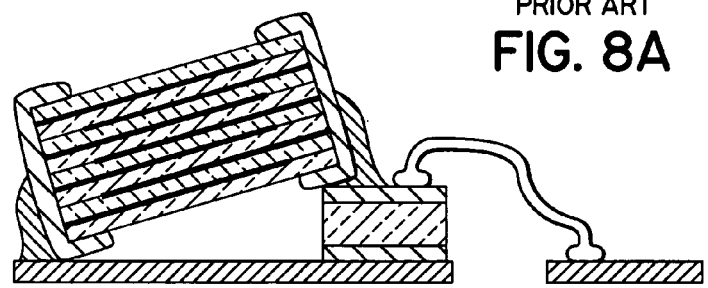
Figure 9B:
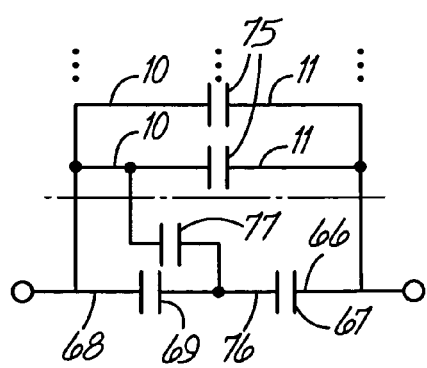
FIG. 9B illustrates an equivalent circuit diagram.

Referring to FIG. 9B, the equivalent circuit diagram of operative capacitances in the capacitor 54 of FIG. 9A, includes not only capacitances 67, 69, 75 between plates 66, 76 and 68, and between plates 10 and 11, respectively, but further capacitances 77 between plate 76 and plate 10 from the upper section. The multiplicity of capacitances and their interrelationship is believed to permit fine-tuning of high frequency response of the device, e.g. by tuning out resonances that cause dips in the curve of capacitance vs. frequency. When the multiple capacitors have peak performance areas that are closely spaced in the high frequency (GHz) range of operation, when combined, the result can be a flatter frequency response than is possible in prior approaches of stacking multiple discrete ceramic capacitors such as shown in FIGS. 8A and 8B.

FIG. 21A illustrates a typical plot of insertion loss as a function of frequency that is obtained when discreet capacitors are connected in parallel substantially as shown in FIG. 8A. Typically, the insertion loss experiences one or more increases, such as that shown at a frequency f1. FIG. 21B illustrates a plot of insertion loss as a function of frequency for the broadband capacitor illustrated in FIG. 9A. As can be seen, the insertion loss is relatively smooth throughout a broad range of frequencies. In the example of FIG. 9A, the bulk capacitance in the larger value, low frequency upper section 60 can be made to have a capacitance in a range of about 10-100 nanofarads. Further, if the capacitance in the lower value, high frequency lower section 62 is made to have a capacitance of about 82 picofarads, the insertion loss plot of FIG. 21B is relatively smooth over a frequency range of about 10 KHz to 10 Ghz and higher.

Figure 10A:
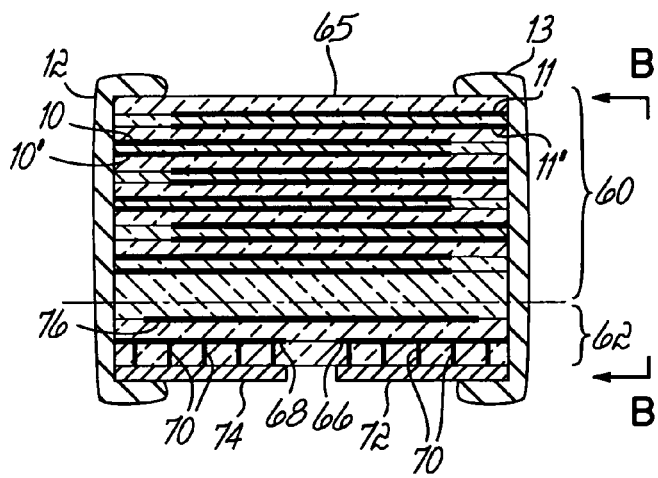
FIG. 10A illustrates a second embodiment of an integrated wideband capacitor in accordance with further aspects of the present invention.

FIG. 10A illustrates an alternative structure for a capacitor 55 that embellishes the capacitor network described in the theory of operation of the capacitor of FIG. 9A. Specifically, in this device, the external conductive plates 72 and 74 in the lower section 62 of the device have been extended toward each other so as to create a capacitance between plates 72 and 74 based upon fringe electric field extending to and from the adjacent edges of those plates.

Also, the edges of floating internal plate 76 have been withdrawn toward the interior of the device, which has the effect of lowering the capacitance and inductance between plate 76 and plates 72 and 74. The reduced capacitance results from the reduced area of plate 76 that is opposed by plates 72 and 74. The reduced inductance results from reduced distances through which there are opposed current flows in plates 76, 72 and 74. Furthermore, the withdrawal of the plate 76, permits some direct capacitive coupling between plate 66 of the lower section 62 of the device and plate 10' of the upper section of the device, introducing an additional capacitance to the device.

Finally, in this device, dual plates have been used in the upper section 60 of the device to reduce series resistance and inductance, albeit at some expense of capacitance value. The use of dual or single plates in the upper section 60 is a possible design choice for any embodiment of the invention described herein, regardless of the elements used in the lower section 62.

Figure 10B:
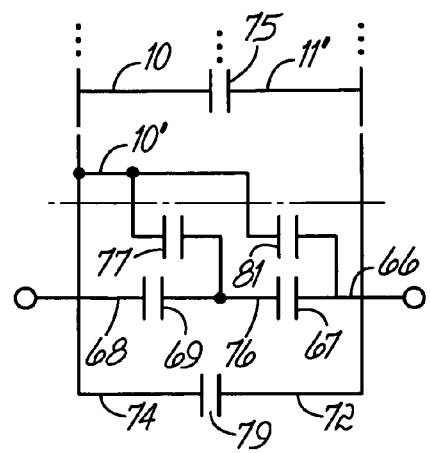
FIG. 10B illustrates an equivalent circuit diagram for this embodiment.

Thus, the equivalent circuit diagram of the capacitor 55 of FIG. 10A, shown in FIG. 10B, as compared to the diagram of FIG. 9B, includes an additional capacitance 79 between plates 72 and 74. This additional capacitance is shown in dotted outline in FIG. 10A, reflecting that the fringe capacitance between plates 72 and 74 may be relatively small compared to the other parallel plate capacitances in the remainder of the lower section 62 of the device. However, this capacitance may well affect the very high frequency performance of the device.

The equivalent circuit diagram of FIG. 10B is further different from FIG. 9B, in an additional capacitance 81 between plate 66 and plate 10'. This additional capacitance will provide an additional resonance that can aid in flattening the high frequency performance of the device.

Figure 1A:
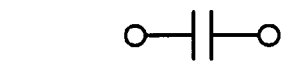
FIGS. 1A and 1B illustrate a capacitor and the known equivalent model therefor.
Figure 1B:
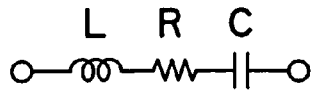

The equivalent circuit diagram of FIG. 10B is still further different from FIG. 9B, in that the capacitances from plates 66 and 76 to plate 10' in the upper section 60 of the device are independently connected to the end terminal, i.e., current flows to and from plate 10' independently of any current flow in the plates 10 and 11' which form the lowermost parallel plate capacitor in section 60 of the device. Providing an independent current flow path, via plate 10', for capacitive current flowing from plate 76, may affect the equivalent series resistance and inductance of the high frequency portion of the device and thus prove an important design feature. It will be appreciated that an independent current path for capacitances coupled from the lower section 62 of the device, provided by a plate positioned in the manner of plate 10' in FIG. 10A, may be used in any embodiment of the invention, regardless of whether that embodiment also includes dual plates throughout the upper section 60 of the device as is the case in FIG. 1A.

Figure 11A:
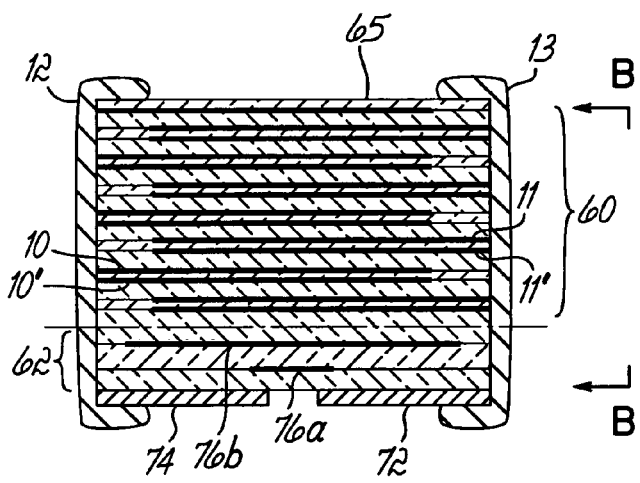
FIG. 11A illustrates a third embodiment of an integrated wideband capacitor in accordance with further aspects of the present invention.

Referring now to FIG. 11A, in a further embodiment, an upper section 60 of a capacitor 56 is formed as in FIG. 10A with pairs of plates 10/10' and 11/11' extending from respective end terminals 12 and 13. The lower section 62 includes a structure distinct from that of FIG. 10A in several respects.

First, the internal plates 66 and 68 and the vias connecting those plates to external plates 72 and 74, have been eliminated. In the space occupied by plates 66, 68 and 76 in the device of FIG. 10A, are two floating plates 76A and 76B, which capacitively couple directly to the external plates 72 and 74. Plate 76A is placed closest to plates 72 and 74 and has a smaller horizontal extent than plate 76B. Capacitive coupling can thus occur, between plates 72 and 74 and plate 76A, as well as between plates 72 and 74 and plate 76B. Furthermore, plates 76A and 76B are capacitively coupled to each other. Also, plate 76B is capacitively coupled to the lowermost plate 11' of the upper section 60 of the device.

Figure 11B:
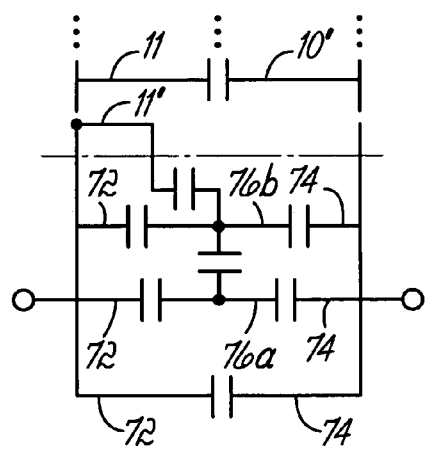
FIG. 11B illustrates an equivalent circuit diagram for this embodiment.

The capacitor 56 has a complex network of capacitances as shown in FIG. 11B. As can be seen, the network of capacitances provides a substantial number of capacitances that can be adjusted (e.g, by altering the size, placement or number of the floating plates 76, and the size of the plates 72 and 74), to optimize high frequency performance of the device.

Figure 12A:
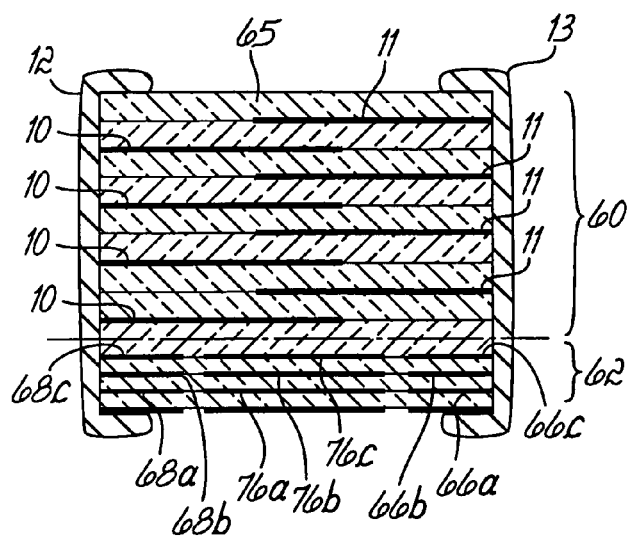
FIG. 12A illustrates a fourth embodiment of an integrated wideband capacitor in accordance with further aspects of the present invention.

Another embodiment is illustrated in FIG. 12A, wherein a capacitor 57 has single plates 10 and 11 in the upper section 60 of the device. However, the single plates 10 and 11 are withdrawn relative to their positions in the devices of FIGS. 9A, 10A and 11A, reducing the overlap of adjacent plates 10 and 11. As a result, the capacitance and series inductance of the capacitors in the upper section 60 of the device are reduced, due to decreased opposed area and decreased opposed current flows. Furthermore, in the lower section 62 of the device, the arrangement of plates shown in the preceding figures has been replaced with a plurality of interior plates 66A, 66B and 66C extending from terminal 13, and a plurality of interior plates 68A, 68B and 68C extending from terminal 12, each respectively opposed edge-to-edge by one of a plurality of interior floating plate 76A, 76B and 76C to form series capacitor pairs. Furthermore, the floating plates 76A, 76B and 76C are capacitively coupled to each other, and the uppermost floating plate 76C is capacitively coupled to the lowermost plate 10 of the upper section 60 of the device. The number of floating plates 76 and interior plates 66 and 68 is subject to adjustment to achieve a desired capacitance. Furthermore, the plates 66 and 68 may be positioned on alternating layers relative to plates 76 to decrease the likelihood of breakdown paths forming along layer boundaries in the ceramic dielectric material.

Figure 12B:
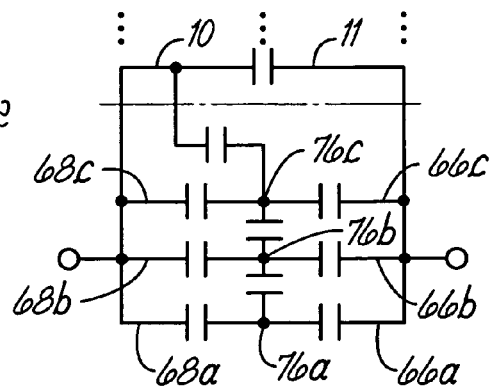
FIG. 12B illustrates an equivalent circuit diagram for this embodiment.

FIG. 12B illustrates the equivalent circuit diagram for the capacitor 57 of FIG. 12A. Notably, the plural series capacitor pairs 137, 139 interconnected by capacitors 140 in this embodiment provide, as before, a large number of capacitances that may be adjusted to optimize high frequency performance. It will be noted that additional, variable capacitances may be created by staggering the widths of the floating plates 76 relative to the plates 66 and 68 so that plates 76, 66 and 68 couple face-to-face to each other as well as through fringe fields coupled to the edges of those plates.

In a still further embodiment, external conductive plates 141 and 142 are connected to the external conductive contacts 12, 13, respectively. An external floating conductive plate 143 is placed between the ends of the conductive plates 141, 142 and is not connected to either of the contacts 12, 13. As shown in FIG. 12B, the floating conductive plate 143 is sufficiently close to the ends of the plates 141, 142 as to form serial fringe-effect capacitances 144, 145 therebetween and an interconnecting capacitance 146 with plate 76a. Again, the capacitances can be adjusted to optimize high frequency performance.

Figure 13:
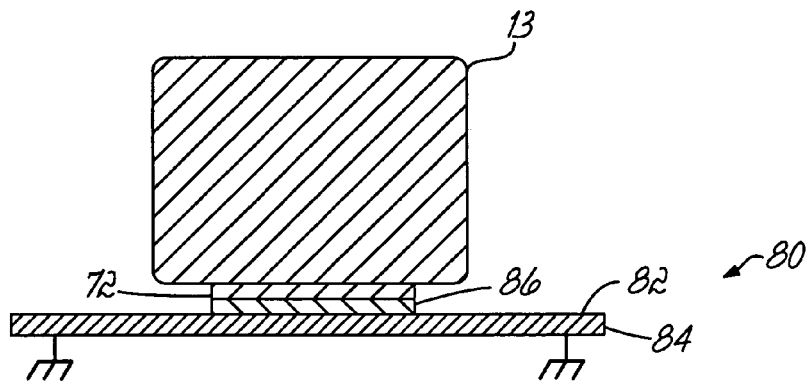
FIG. 13 is an end view of the embodiments of FIGS. 10A and 11A in accordance with further aspects of the present invention.

Referring now to FIG. 13, an end view of the devices of FIGS. 10A and 11A can be used to discuss additional high frequency optimization steps. FIG. 13 shows a device mounted to a surface mount circuit board 80, having a non-conductive outer surface 82 and a buried ground plane 84 of conductive material. Conductive traces 86 run along the upper surface 82 of board 80, to interconnect components such as integrated circuits, discrete capacitors, and the like. The devices of FIGS. 10A and 11A include external conductive plates 74 and 76 which may be directly mounted to these conductive traces using conductive epoxy, or wave soldering.

FIG. 13 illustrates that the width of the capacitive device may be wider than the width of the conductive traces 86 formed on the circuit board 80. In this event, the external conductive plates 72 and 74 may be formed with a width that matches that of the traces 86, to avoid unintended capacitive coupling to ground plane 84 from plates 72 and 74. As seen in FIG. 13, when plates 72 and 74 (plate 72 being seen in FIG. 13) are the same width as the traces 86, no additional capacitive coupling to ground is created by plates 72 and 74. The width of the internal plates such as 66, 68, 76, 10 and 11 may be made narrow as well, but likely can be made as wide as the entire device, for the reason that plates 72 and 74 are substantially closer to ground plane 84 than the other plates internal to the device and thus are more likely to create coupling to ground.

Figure 14:
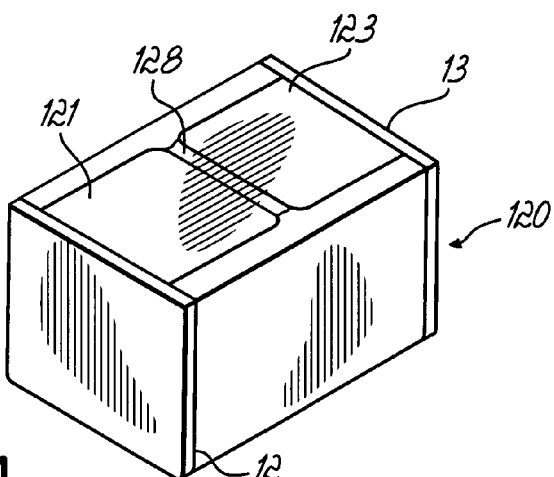
FIG. 14 is a perspective view of another embodiment of an integrated wideband capacitor in accordance with the principles of the present invention.
Figure 15A:
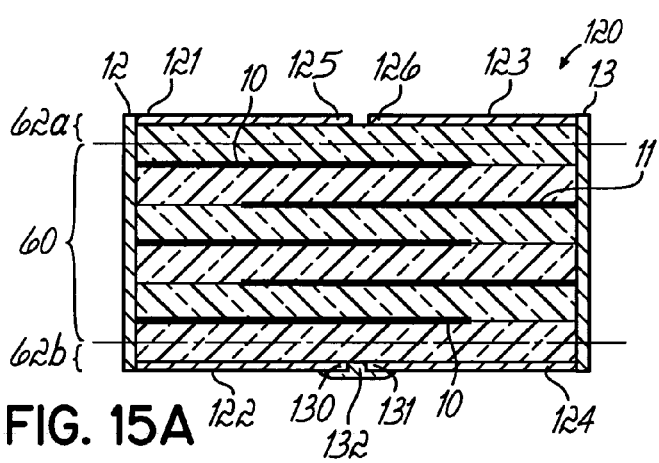
FIG. 15A illustrates an embodiment of the capacitor of FIG. 14.

FIGS. 14 and 15A illustrate a further embodiment of a capacitor 120 comprised of an integrated capacitor array. Overlapping conductive plates 10, 11 are connected to external conductive contacts 12, 13, respectively. Conductive pads 121, 122 extend over respective upper and lower surfaces of the capacitor 120 and are electrically connected to the contact 12. Similarly, conductive pads 123, 124 also extend over respective upper and lower surfaces of the capacitor 120 and are connected to the contact 13. The conductive pads 121-124 facilitate mounting the capacitor 120 to circuits on a printed circuit board. As previously described, a lower frequency, higher value capacitor section 60 provides a plurality of parallel capacitances 75 between conductive plates 10, 11.

Figure 15B:
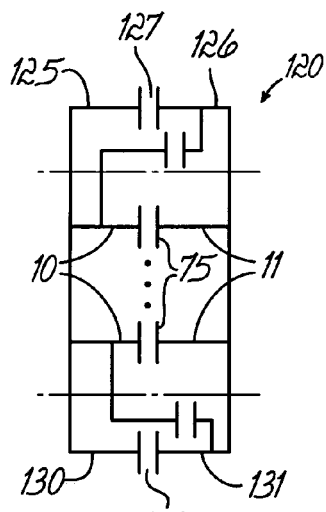
FIG. 15B illustrates an equivalent circuit diagram for this embodiment.

The ends 125, 126 of the respective conductive pads 121, 123 are disposed on the upper surface of the capacitor 120 sufficiently close to each other so that a fringe-effect capacitance 127 (FIG. 15B) is formed therebetween. The fringe-effect capacitor 127 formed between the ends 125, 126, of respective pads 121, 123 provides an integrated, higher frequency, lower value capacitance section 62a. In a similar manner, a fringe-effect capacitance 129 is formed between the ends 130, 131 of the respective pads 122, 124 on a lower side of the integrated capacitor 120. The fringe-effect capacitance 129 provides a second, higher frequency, lower value capacitance section 62b that is substantially identical to the capacitance section 62a. While the fringe effect capacitances 127, 129 may be relatively small compared to other overlapping parallel plate capacitances 75 within the capacitor 120, the fringe effect capacitances 127, 129 have been found to effect the high frequency performance of the capacitor 120.

The ends 130, 131 may be separated by only 0.002 of an inch. In order to minimize the opportunity for conduction between the ends 130, 131 of the respective pads 122, 124, an insulating coating or material 132 is provided therebetween. The insulating coating 132 consists of either a high temperature fired insulator, for example, glass, or a low temperature curing material, for example, epoxy, silicone, polymer, etc. However, in other embodiments, depending on the size of the gap between the ends 125, 126 of respective plates 121, 123 and other factors, a capacitor designer may choose not to use an insulating material between the ends 125, 126. FIG. 14 also illustrates another alternative embodiment in that the ends of the chip are provided with an insulating coating 128 to provide an electrical barrier from shorting with other devices. The insulating coating 128 is substantially similar to the insulating coating 132. An oxidation process or an anodizing process of the underlying termination material is also compatible and a viable alternative.

FIG. 16 illustrates another example of a broadband capacitor 87 having integrated capacitor array. As shown in FIG. 17A, the broadband capacitor 87 includes a low frequency, higher value bulk capacitor section 60 comprised of a first plurality of conductive plates 10 connected to an external contact 12 and a second plurality of opposed parallel plates 11 connected to the external contact 13. As shown in FIG. 17B, in an equivalent circuit of the capacitor 87, the plates 10, 11 form capacitors 88 within a bulk capacitance section 60. It should be noted that the plates 10, 11 are disposed at an orientation that is substantially perpendicular to an external surface 64 of the dielectric body 65 and a longitudinal centerline 89 of the broadband capacitor 87. Further, in use, one of the metallized contact areas 12, 13 is attached to a conductor (not shown) extending over a major planar surface 61 of a PCB 63, so that the external surface 64 is substantially parallel to the major surface 61. The plates 10, 11 are substantially perpendicular to the PCB major surface 61.

The broadband capacitor 87 further has a pair of higher frequency, lower value capacitor sections 62a, 62b that are disposed at opposite ends of the bulk capacitor section 60. Each of the capacitor sections 62a, 62b has a respective conductive floating plate 90a, 90b that is not connected to either of the metallized contact areas 12, 13. First electrode plates 91a, 91b form respective capacitors 92a, 92b with respective floating plates 90a, 90b. Similarly, electrode plates 93a, 93b form respective capacitors 94a, 94b with the respective floating plates 90a, 90b. The plates 91, 93 are non-overlapping with each other and operative to provide a series circuit of the capacitors 92, 94. In addition, capacitors 95a, 95b are formed between one of the plates 10 and a respective plate 93a, 93b.

Referring to FIGS. 18A and 18B, another example of an integrated capacitor array is represented by the broadband capacitor 96. The low frequency capacitance section 60 and high frequency capacitance section 62b of FIGS. 18A and 18B are substantially identical in construction to the low frequency capacitor section 60 and high frequency capacitor section 62b previously described with respect to FIGS. 17A, 17B. However, as shown in FIG. 18A, the metallized plates 12, 13 extend over an end of the capacitor 96 and have respective ends 97, 98 sufficiently close to each other so as to form a fringe-effect capacitance 99 therebetween as shown in FIG. 18B. To prevent conduction between the plate ends 97, 98, the space therebetween is filled with an insulating material 132 as described with respect to FIGS. 14 and 15; however, as will be appreciated, the use of such a coating is optional and depends on many factors.

Referring to FIGS. 19A and 19B, a further example of an integrated capacitor array is represented by the broadband capacitor 100. The low frequency capacitance section 60 is substantially the same as in other embodiments; however, there are differences in the high frequency capacitance sections 62a, 62b. In high frequency section 62a, a pair of conductive electrodes 101, 102 are disposed between an electrode 11 in the low frequency capacitance section 60 and a first floating electrode 104. That arrangement of electrodes is effective to provide capacitors 105, 106, 107 as shown in FIG. 19B. Further, as shown in FIG. 19A, the metallized plates 12, 13 extend over one end of the broadband capacitor 100 and have respective ends 108, 109 sufficiently close to each other so as to form a fringe-effect capacitance 110 therebetween as shown in FIG. 19B. To prevent conduction between the plate ends 108, 109, the space therebetween is filled with an insulating material 128 as described with respect to FIGS. 14 and 15.

In contrast, in the high frequency capacitance section 62b, a floating electrode 111 is disposed between a pair of electrodes 112, 113 and an electrode 10 in the low frequency capacitance section 60. That arrangement of plates 111, 112, 113 with the plate 10 provides capacitors 114, 115, 116 as shown in FIG. 20B. Further, as shown in FIG. 19A, the metallized plates 12, 13 also extend over an opposite end of the capacitor 100 and have respective ends 117, 118 sufficiently close to each other so as to form a fringe-effect capacitance 119 therebetween as shown in FIG. 19B. However, in contrast to the capacitance section 62a, the capacitor design is such that an insulating coating is not required between the plate ends 117, 118. In addition, the ends 108, 109 of respective contact plates 12, 13 form respective capacitors 135, 136 with the floating plate 104.

Figure 20A:
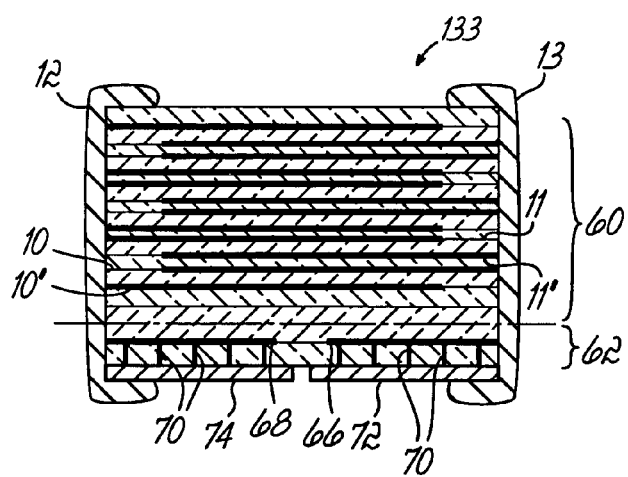
FIG. 20A illustrates a still further embodiment of the capacitor of FIG. 16.
Figure 20B:
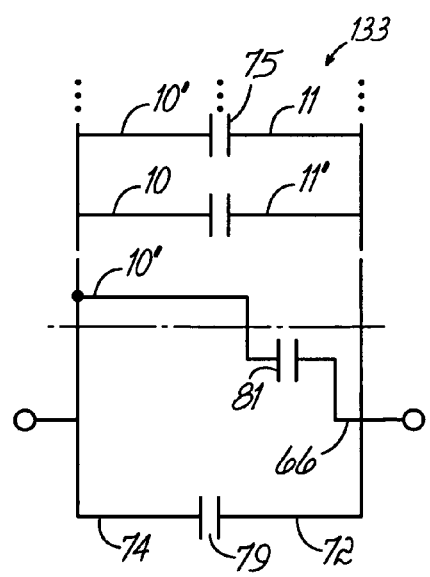
FIG. 20B illustrates an equivalent circuit diagram for this embodiment.

FIGS. 20A, 20B illustrate a still further embodiment of an integrated capacitor array forming a broadband capacitor 133. FIGS. 20A, 20B illustrate an integrated capacitor array that is substantially identical to the previously described capacitor illustrated in FIGS. 10A, 10B with two exceptions. First, the floating electrode plate 76 present in FIG. 10A has been eliminated from the embodiment of FIG. 20A. Second, the metallized plates 72, 74 extending from the respective contacts 13, 12 form a fringe-effect capacitance 79 therebetween. Although small, the fringe-effect capacitance 79 is sufficiently effective at higher frequencies to allow the elimination of the floating plate 76 of FIG. 10A, thereby reducing the manufacturing cost of the broadband capacitor 133 with respect to the capacitor shown in FIG. 10A. As will be appreciated, in another embodiment, a capacitor designer may choose to minimize the potential for conduction between ends of the plates 72, 74 by applying an insulating material in the gap between the plates 72, 74 similar to the material 132 of FIG. 14.

Figure 22A:
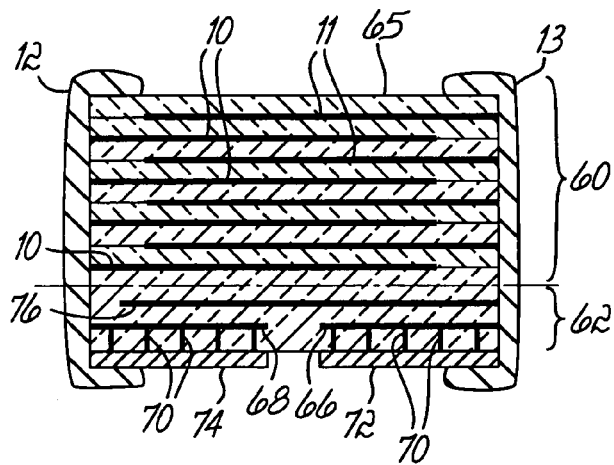
FIG. 22A illustrates a further embodiment of an integrated wideband capacitor in accordance with further aspects of the present invention.
Figure 22B:
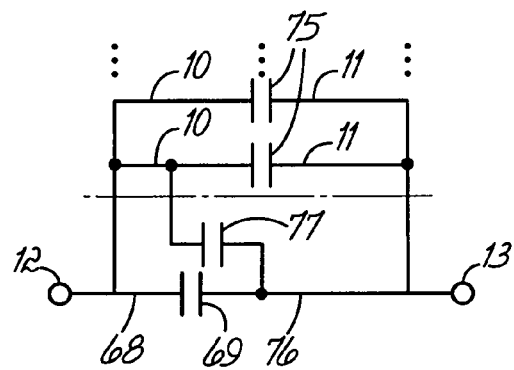
FIG. 22B illustrates an equivalent circuit diagram for this embodiment.

Referring now to FIG. 22A, this embodiment of an integrated capacitor is similar to FIG. 9A except that the plate 76 now contacts one of the conductive contacts, in this example, conductive contact 13. Thus, in this example, only plate 68 is capacitively coupled to the interior plate 76, which, referring to FIG. 22B, forms a single capacitance 69 from plate 68 to plate 76, that is, between the conductive contacts 12, 13. The high frequency performance is similar to that described with respect to integrated capacitor of FIG. 9A.

Figure 23A:
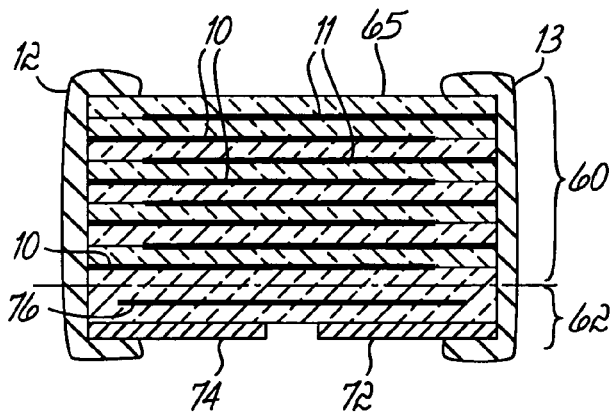
FIG. 23A illustrates a still further embodiment of an integrated wideband capacitor in accordance with further aspects of the present invention.
Figure 23B:
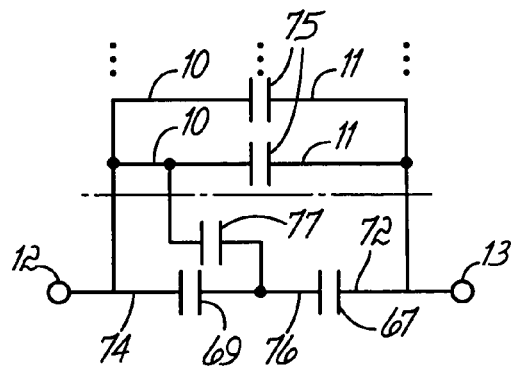
FIG. 23B illustrates an equivalent circuit diagram for this embodiment.

Referring now to FIG. 23A, this embodiment of an integrated capacitor is also similar to FIG. 9A except that the internal plates 66 and 68 and connecting vias 70 have been removed. Thus, a high frequency capacitor is formed in a lower section 62 by a series combination of capacitances 67, 69, from floating plate 76 to external conductive plates 72 and 74, respectively, which are printed on the exterior of the ceramic dielectric body 65. The absence of the interior plates 66, 68 and vias 70 increases the series resistance. Again, the high frequency performance is similar to that described with respect to integrated capacitor of FIG. 9A.

Referring to FIG. 24A, a further example of an integrated capacitor array is represented by the broadband capacitor 148. The low frequency capacitance section 60 is substantially the same as in other embodiments with parallel plates 10, 11 that form the capacitances 88 electrically connected in parallel as shown in FIG. 24B. In the high frequency section 62, parallel plates 150 are electrically connected to external contact 12 and extend in a direction substantially perpendicular to the external surface 64 of the dielectric body 65. Distal ends of respective plates 150 are sufficiently close to the external contact 13 so as to form respective fringe-effect capacitances 152 therebetween as shown in FIG. 24B. The fringe-effect capacitances 152 are electrically connected to the parallel capacitances 88 in a parallel circuit. In use, the capacitor 148 is mountable on a PCB 63 such that the external surface 64 is substantially parallel to a major surface 61.

Referring to FIG. 25A, in another embodiment, a broadband capacitor 153 has a low frequency capacitance section 60 that is substantially the same as in other embodiments with parallel plates 10, 11 that form the capacitances 88 electrically connected in parallel as shown in FIG. 25B. Further, the capacitor 153 has a first high frequency capacitance section 62a with plates 150 extending through one end of the dielectric body 65 in a manner substantially the same as the high frequency section 62 described with respect to FIG. 24A. Further, as shown in FIG. 25B, the plates 150 in the high frequency capacitance section 62a form respective capacitances 152. In addition, the capacitor 153 has a second high frequency capacitance section 62b with plates 154 extending through an opposite end of the dielectric body 65. The plates 154 have respective distal ends sufficiently close to the external contact 13 so as to form respective fringe-effect capacitances 156 as shown in FIG. 25B. The fringe-effect capacitances 152 and 156 are electrically connected in a parallel circuit with each other and the parallel capacitances 80. The low frequency section 60 is located intermediate the ends of the dielectric body 65 and between the high frequency sections 62a and 62b. Again the plates 10, 11, 150, 154 are substantially perpendicular to a dielectric body external surface 64; and the capacitor 153 is often mounted so that the external surface 64 is substantially parallel to a PCB major surface 61.

Referring to FIGS. 26A and 26B, a still further example of an integrated capacitor array is represented by the broadband capacitor 158. The low frequency capacitance section 60 is substantially the same as in other embodiments with parallel plates 10, 11 that form the capacitances 88 electrically connected in parallel as shown in FIG. 26B. Further, the high frequency capacitance section 62 is substantially the same as the high frequency capacitance section 62b shown and described with respect to FIGS. 19A and 19B to provide a series circuit of capacitances 115 and 116 shown in FIG. 26B. In the broadband capacitor 158 of FIGS. 26A and 26B, a resistance 160 is electrically connected to the external contact 12. Further, the resistance 160 is electrically connected in series with the series circuit of the capacitances 115 and 116. The parallel capacitances 88 are electrically connected in parallel with a series circuit formed by the resistance 160 and capacitances 115, 116. Again the plates 10, 11, 111, 112, 113 are substantially perpendicular to a dielectric body external surface 64; and the capacitor 158 is often mounted so that the external surface 64 is substantially parallel to the PCB major surface 61.

Referring to FIGS. 27A and 27B, another example of an integrated capacitor array is represented by the broadband capacitor 161. The low frequency capacitance section 60 is substantially the same as in other embodiments with parallel plates 10, 11 that form the capacitances 88 electrically connected in parallel as shown in FIG. 27B. Further, the high frequency capacitance section 62 is substantially the same as the high frequency capacitance section 62 shown and described with respect to FIGS. 25A and 25B to provide a parallel circuit of fringe-effect capacitances 152 shown in FIG. 27B. In the broadband capacitor 161 of FIGS. 27A and 27B, a resistance 162 is electrically connected to the external contact 12. Further, the resistance 160 is electrically connected in series with the parallel circuit of fringe-effect capacitances 152. The parallel capacitances 88 are electrically connected in parallel with a series circuit formed by the resistance 162 and the parallel circuit of capacitances 152. Again the plates 10, 11, 150 are substantially perpendicular to a dielectric body external surface 64; and the capacitor 161 is often mounted so that the external surface 64 is substantially parallel to the PCB major surface 61.

Referring to FIGS. 28A and 28B, a still further example of an integrated capacitor array is represented by the broadband capacitor 163. The low frequency capacitance section 60 is substantially the same as in other embodiments to provide the capacitances 88 electrically connected in parallel. Further, the high frequency capacitance section 62 is substantially the same as the high frequency capacitance section 62 shown and described with respect to FIGS. 19A and 19B to provide a series circuit of capacitances 115 and 116 shown in FIG. 28B. In the broadband capacitor 163 of FIGS. 28A and 28B, the parallel capacitances 88 are connected in a parallel circuit with the series circuit of capacitances 115, 116. Further, a resistance 164 is electrically connected to the external contact 12 and is electrically connected in series with the parallel circuit formed by the parallel capacitances 88 and series circuit of capacitances 115 and 116. Again the plates 10, 11, 111, 112, 113 are substantially perpendicular to a dielectric body external surface 64; and the capacitor 163 is often mounted so that the external surface 64 is substantially parallel to the PCB major surface 61.

Figure 29:
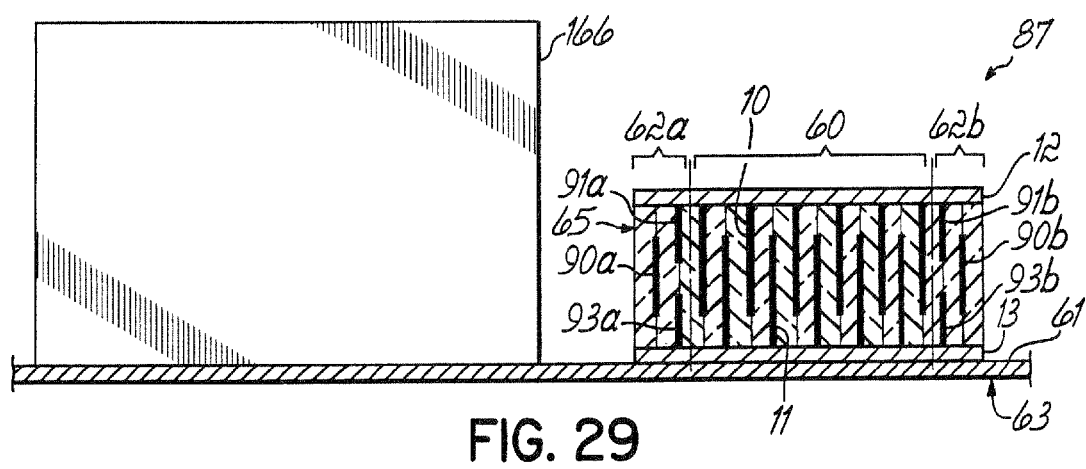
FIG. 29 illustrates an exemplary application of the integrated wideband capacitors shown and described herein in accordance with further aspects of the present invention.

In a further example of use of the broadband capacitors shown and described herein, a broadband capacitor 87 as shown and described in FIGS. 17A and 17B is shown in FIG. 29 mounted on a PCB 63 with an integrated circuit ("IC") 166. The capacitor 87 is mounted such that the plates 10, 11, 90, 91, 93 are substantially perpendicular to the PCB major surface 61. Further, the capacitor 87 is oriented on the PCB 63 such that the plates 90a, 91a, 93a of the high frequency section 62a are closer to the IC 166 than the plates 10, 11 of the low frequency section 60. It is believed that such an orientation of the capacitor 87 provides the best performance of the capacitor 87 in terms of measured insertion loss. Capacitor performance is worse if the capacitor is rotated 90 degrees from the illustrated orientation, thereby placing the low frequency section plates 10, 11 closer to the IC 166.

Further, the capacitor 87 is physically very small and difficult to handle. To simplify assembly of the capacitor 87 on the PCB 63, the capacitor 87 has a substantially identical high frequency section 62b on an opposite end of the dielectric body 65. Therefore, the capacitor 87 can be mounted on the PCB 63 with the plates 90b, 91b, 93b of the high frequency section 62b located closer to the IC 166 than the low frequency section plates 10, 11; and again, a superior capacitor performance is achieved in terms of measured insertion loss.

In accordance with the foregoing, an improved capacitive device is formed by integrating low and high frequency performance in a single device. Providing one or more higher frequency, lower value capacitors results in fewer resonances and lower insertion loss amplitudes. With less insertion loss, an improved response can be obtained over a substantial bandwidth, for example, 400 KHz-100 GHz. Further, for a particular application, by building and testing capacitive devices using different combinations of the capacitive arrays described herein, a particular size capacitor can be designed to operate over a desired bandwidth.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Specifically, techniques described in these multiple embodiments may be combined in many ways beyond the particular combinations shown herein. For example, the independently adjustable parameters in forming a device in accordance with aspects of the invention include at least the following:

1. the use or not of interior plates 66 and 68 in higher frequency sections 62, 2. the gap between plates 72 and 74, 66 and 68, 97 and 98, 108 and 109, 117 and 118, 125 and 126, 103 and 131 and the fringe capacitances created thereby, 3. the number of floating plates 76, 90, 104, 111 and their distances from other plates in respective higher frequency sections 62 and adjacent plates in respective lower frequency sections 60, 4. the width, spacing and overlap characteristics of the floating plates 76, 90, 104, 111, 5. the extent to which coupling is permitted between non-floating plates in higher frequency sections 62 and adjacent plates in respective lower frequency sections 60, 6. the use of fringe or face-to-face coupling between floating plates 76, 90, 104, 111 and other plates in respective higher frequency sections 60, 7. the use of dual or single plates, withdrawn or fully overlapping plates in lower frequency sections 60, and 8. the relative geometry of external plates 72 and 74 on the device, and the traces 86 on the circuit board to which the device is mounted.

A further potential variable to adjust, is the type of ceramic used. Indeed, different layers in the ceramic structure may be made of ceramic materials having different molecular structures. Different ceramic materials may exhibit different performance in various attributes, such as relative dielectric constant, polarization, breakdown field strength, curing behavior, mechanical strength and mechanical stress and strain behavior. For example, a relatively low dielectric ceramic having relatively good high frequency behavior may be used in the lower section 62 of a device, while a relatively high dielectric ceramic having relatively poorer high frequency behavior may be used in the upper section 60 of the device.

The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method for mounting a capacitor comprising the steps:
   placing an integrated circuit on a major surface of a printed circuit board;
   providing a capacitor comprising
   a substantially monolithic dielectric body having a first external surface positioned on and substantially parallel to the major surface of the printed circuit board;
   a lower frequency, higher value, first capacitor formed by a first plurality of conductive plates in the dielectric body; and
   a higher frequency, lower value, second capacitor formed by a second plurality of conductive plates in the dielectric body;
   placing the capacitor on the printed circuit board such that the plates of the higher frequency, lower value, second capacitor are closer to the integrated circuit than the plates of the lower frequency, higher value, first capacitor.

2. The method of claim 1 wherein the first plurality of conductive plates comprise respective major surfaces oriented substantially perpendicular to the first external surface and form a plurality of capacitors connected in parallel with each other.

3. The method of claim 2 wherein the second plurality of conductive plates comprise respective major surfaces oriented substantially perpendicular to the first external surface.

4. The method of claim 3 wherein the first capacitor is electrically connected in parallel with the second capacitor.

5. An apparatus comprising:
   a printed circuit board;
   an integrated circuit placed on a major surface of the printed circuit board;
   a capacitor comprising
   a substantially monolithic dielectric body comprising a first external surface positioned on and substantially parallel to the major surface of the printed circuit board;
   a lower frequency, higher value, first capacitor formed by a first plurality of conductive plates in the dielectric body;
   and a higher frequency, lower value, second capacitor formed by a second plurality of conductive plates in the dielectric body, wherein the capacitor is placed on the printed circuit board such that the plates of the higher frequency, lower value, second capacitor are closer to the integrated circuit than the plates of the lower frequency, higher value, first capacitor.

6. The apparatus of claim 5 wherein the first plurality of conductive plates comprise respective major surfaces oriented substantially perpendicular to the first external surface and form a plurality of capacitors connected in parallel with each other.

7. The apparatus of claim 6 wherein the second plurality of conductive plates comprises respective major surfaces oriented substantially perpendicular to the first external surface.

8. The apparatus of claim 7 wherein the first capacitor is electrically connected in parallel with the second capacitor.

9. A capacitor comprising:
   a substantially monolithic dielectric body comprising one end, an opposite end, and first and second external surfaces;
   first and second contacts on the first and second external surfaces, respectively;

a higher frequency, lower value, first capacitor formed by first conductive plates in the dielectric body near the one end, the first capacitor being electrically connected between the first and second contacts;

a higher frequency, lower value, second capacitor formed by second conductive plates in the dielectric body near the opposite end, the second capacitor being electrically connected between the first and second contacts in a parallel circuit with the first capacitor;

a lower frequency, higher value third capacitor formed by third conductive plates in the dielectric body intermediate the one end and the opposite end and between the first capacitor and the second capacitor, the third capacitor being electrically connected between the first and second contacts in a parallel circuit with the first capacitor and the second capacitor.

10. The capacitor of claim 9 wherein the first, second and third plates are substantially perpendicular to the first external surface of the dielectric body.

11. The capacitor of claim 10 wherein the first external surface is substantially parallel to the second parallel surface.

12. A capacitor comprising:
a substantially monolithic dielectric body having a first external surface;
at least one conductive first plate in the dielectric body substantially perpendicular to the first external surface;
at least one conductive second plate in the dielectric body substantially perpendicular to the first external surface and forming a first capacitor with the first plate;
a conductive first external contact electrically connected to the first plate;
a conductive second external contact electrically connected to the second plate;
a conductive third plate located in the dielectric body near one end of the dielectric body, the third plate electrically connected to one of the first contact and the second contact and forming a fringe capacitance with an other of the first contact and the second contact.

13. The capacitor of claim 12 further comprising:
a conductive fourth plate located in the dielectric body near an opposite end of the dielectric body, the first plate and the second plate being located intermediate the one end and the opposite end of the dielectric body and between the third plate and the fourth plate, the fourth plate electrically connected to the one of the first contact and the second contact and forming a fringe capacitance with the other of the first contact and the second contact.

14. The capacitor of claim 12 further comprising:
a resistive element positioned between the dielectric body and the one of the first contact and the second contact, the resistive element being electrically connected between the one of the first contact and the second contact and the third plate, and the third plate being conductively connected to the one of the first contact and the second contact through the resistive element.

15. The capacitor of claim 12 wherein the first external surface is adapted to be positioned substantially parallel to a major surface of a circuit board.

16. The capacitor of claim 12 wherein the first external surface is adapted to be positioned substantially perpendicular to a major surface of a circuit board.

17. A capacitor comprising:
a substantially monolithic dielectric body having a first external surface;
conductive first plates in the dielectric body substantially perpendicular to the first external surface;
conductive second plates in the dielectric body substantially perpendicular to the first external surface and forming first capacitors with the first plates;
a conductive external first contact electrically connected to the first plates;
a conductive external second contact electrically connected to the second plates; and
conductive third plates located in the dielectric body near one end of the dielectric body, the third plates electrically connected to one of the contacts and forming first fringe capacitances with an other contact near the one end of the dielectric body.

18. The capacitor of claim 17 further comprising:
conductive fourth plates located in the dielectric body near an opposite end of the dielectric body, the fourth plates electrically connected to the other of the first contact and the second contact and forming fringe capacitances with the one of the first contact and the second contact near the opposite end of the dielectric body, the first capacitors being located intermediate the ends of the dielectric body between the first and the second fringe capacitances.

19. The capacitor of claim 17 further comprising:
a resistive element positioned between the dielectric body and the one of the first contact and the second contact, the resistive element being electrically connected between the one of the first contact and the second contact and the third plates, and the third plates being conductively connected to the one of the first contact and the second contact through the resistive element.

20. A capacitor comprising:
a substantially monolithic dielectric body having conductive first and second contacts on respective first and second external surfaces of the dielectric body;
a lower frequency, higher value first capacitor formed by conductive first and second plates in the dielectric body electrically connected to the first and second contacts, respectively;
a higher frequency, lower value second capacitor formed by further conductive plates in the dielectric body;
a resistive element electrically connected between one of the first capacitor and the second capacitor and the first contact; and
conductive third plates in the dielectric body electrically connected to one of the first contact and the second contact and forming respective fringe effect capacitances with an other of the first contact and the second contact, the fringe effect capacitances being electrically connected in a parallel circuit.

21. The capacitor of claim 20 wherein the first surface is adapted to be positioned substantially parallel to a major surface of a circuit board.

22. The capacitor of claim 20 wherein the first, second and further plates comprise respective major surfaces substantially perpendicular to the first external surface.

23. The capacitor of claim 20 wherein the further plates comprise:
a conductive third plate in the dielectric body;
a conductive fourth plate in the dielectric body; and
a conductive fifth plate in the dielectric body not electrically connected to either the first contact or the second contact, the fifth plate being substantially parallel to the third plate and the fourth plate and forming respective third and fourth capacitors therewith, the third and fourth capacitors being in a series circuit.

24. The capacitor of claim 23 wherein the resistive element is electrically connected between the series circuit and one of the first contact and the second contact to form a resistance electrically connected in series with the series circuit of the third and fourth capacitors.

25. The capacitor of claim 23 wherein the third plate is electrically connected to the first plate and the fourth plate is electrically connected to the second plate to place the series circuit and the first capacitor in a parallel circuit, and the resistive element is connected between the parallel circuit and one of the first and second contacts to form a resistance electrically connected in series with the parallel circuit.

26. The capacitor of claim 23 wherein the third plate forms a first fringe effect capacitor with the fourth plate.

27. The capacitor of claim 20 wherein the resistive element is electrically connected between the parallel circuit of fringe effect capacitances and one of the first contact and the second contact to form a resistance electrically connected in series with the parallel circuit of fringe effect capacitances.

28. The capacitor of claim 20 wherein the first capacitor is electrically connected in parallel with the parallel circuit of fringe effect capacitances to form a second parallel circuit, and the resistive element is connected between the second parallel circuit and one of the first and second contacts to form a resistance electrically connected in series with the second parallel circuit.

29. A monolithic capacitor, comprising
a three-dimensional dielectric body;
first and second external conductive contacts disposed on the dielectric body;
a first conductive plate internal to the dielectric body, extending within the body and conductively connected to the first external conductive contact;
a second conductive plate internal to the dielectric body, extending within the body and conductively connected to the second external conductive contact, the first and second conductive plates being substantially parallel and opposed in at least one region of the body and forming a capacitor therebetween;
a third conductive plate internal to the dielectric body, extending within the body and conductively connected to the first external conductive contact, the second and third conductive plates being substantially parallel and opposed in at least one region of the body and forming a capacitor therebetween;
a fourth conductive plate disposed within the dielectric body and conductively connected to the first external conductive contact, the fourth conductive plate substantially parallel to and opposed to the third conductive plate to form a capacitor therebetween;
a first external conductive plate positioned on an external surface of the dielectric body and conductively connected to the first external conductive contact;
at least one first via filled with conductive material disposed in the dielectric body and extending between the first external conductive plate and the fourth conductive plate;
a fifth conductive plate disposed within the dielectric body and conductively connected to the second external conductive contact, the fifth conductive plate substantially parallel to and opposed to the third conductive plate;

a second external conductive plate positioned on an external surface of the dielectric body and conductively connected to the second external conductive contact, the second external conductive plate being substantially coplanar with the first external conductive plate; and
at least one second via filled with conductive material disposed in the dielectric body and extending between the second external conductive plate and the fifth conductive plate.

30. The monolithic capacitor of claim 29 further comprising additional conductive plates internal to the dielectric body, extending within the body and conductively connected to the conductive contacts on respective first and second exterior surfaces thereof, wherein the additional plates are substantially parallel and arranged in opposed pairs in at least one region of the body, the respective plates in each pair extending from respective ones of the contacts, to form additional capacitors.

31. The monolithic capacitor of claim 29 wherein the third conductive plate is substantially coextensive with the first and second conductive plates.

32. A monolithic capacitor comprising
a three-dimensional dielectric body, having first and second external conductive contacts;
a first conductive plate internal to said dielectric body, extending within said body and conductively connected to said first external conductive contact;
a second conductive plate internal to said dielectric body, extending within said body and conductively connected to said second external conductive contact, wherein said first and second conductive plates are substantially parallel and opposed in at least one region of said body, to form a capacitor therebetween;
a third conductive plate internal to said dielectric body, extending within said body and not conductively connected to any external conductive contacts, wherein said second and third conductive plates are substantially parallel and opposed in at least one region of said body, to form a capacitor therebetween;
a first external conductive plate positioned on an external surface of the dielectric body and conductively connected to the first external conductive contact; and
a second external conductive plate positioned on an external surface of the dielectric body and conductively connected to the second external conductive contact, the second external conductive plate being substantially coplanar with the first external conductive plate.

33. The monolithic capacitor of claim 32 further comprising additional conductive plates internal to the dielectric body, extending within the body and conductively connected to the conductive contacts on respective first and second exterior surfaces thereof, wherein the additional plates are substantially parallel and arranged in opposed pairs in at least one region of the body, the respective plates in each pair extending from respective ones of the contacts, to form additional capacitors.

34. The monolithic capacitor of claim 32 wherein the third conductive plate is substantially coextensive with the first and second conductive plates.

* * * * *